(12) United States Patent
Vispute et al.

(10) Patent No.: US 9,856,578 B2
(45) Date of Patent: Jan. 2, 2018

(54) METHODS OF PRODUCING LARGE GRAIN OR SINGLE CRYSTAL FILMS

(71) Applicants: Ratnakar D. Vispute, Columbia, MD (US); Andrew Seiser, Myersville, MD (US)

(72) Inventors: Ratnakar D. Vispute, Columbia, MD (US); Andrew Seiser, Myersville, MD (US)

(73) Assignees: Solar-Tectic, LLC, Briarcliff Manor, NY (US); Blue WAVE SEMI-Conductors, Inc., Baltimore, MD (US)

( * ) Notice: Subject to any disclaimer, the term of this patent is extended or adjusted under 35 U.S.C. 154(b) by 63 days.

(21) Appl. No.: 14/256,619

(22) Filed: Apr. 18, 2014

(65) Prior Publication Data
US 2014/0245947 A1   Sep. 4, 2014

Related U.S. Application Data

(60) Provisional application No. 61/879,275, filed on Sep. 18, 2013.

(51) Int. Cl.
C30B 23/06 (2006.01)
C30B 29/16 (2006.01)
(Continued)

(52) U.S. Cl.
CPC .......... *C30B 23/066* (2013.01); *C23C 14/081* (2013.01); *C23C 14/30* (2013.01);
(Continued)

(58) Field of Classification Search
CPC combination set(s) only.
See application file for complete search history.

(56) References Cited

U.S. PATENT DOCUMENTS

| 465,231 A | * | 12/1891 | Nyberg et al. | ........... B61G 1/28 |
| | | | | 213/188 |
| 3,639,165 A | * | 2/1972 | Rairden, III | ............ C23C 14/24 |
| | | | | 204/192.22 |

(Continued)

FOREIGN PATENT DOCUMENTS

EP   2093306 A1   8/2009

OTHER PUBLICATIONS

Findikoglu, A et al. "Aligned-Crystalline Si Films on Non-Single-Crystalline Substrates", Mater. Res. Soc. Symp. Proc., 2009, pp. 1-12, vol. 1150, Materials Research Society, U.S.A.

(Continued)

*Primary Examiner* — Duy Vu N Deo
*Assistant Examiner* — Erin F Bergner
(74) *Attorney, Agent, or Firm* — Carter Ledyard & Milburn LLP

(57) ABSTRACT

Highly textured [111] oriented films such as MgO crystalline films are deposited by e-beam evaporation on ordinary soda-lime glass. Semiconductor films such as silicon can be deposited on these MgO films using eutectics at temperatures below the softening point of ordinary glass and having extremely high textured and strong [111] orientation. The invention may be used for efficient and cost effective solar cells, displays, etc.

10 Claims, 3 Drawing Sheets

(51) Int. Cl.
*C23C 14/08* (2006.01)
*C23C 14/30* (2006.01)
*C23C 14/52* (2006.01)
*C23C 14/54* (2006.01)

(52) U.S. Cl.
CPC ............ *C23C 14/52* (2013.01); *C23C 14/541* (2013.01); *C30B 29/16* (2013.01)

(56) References Cited

U.S. PATENT DOCUMENTS

| | | | | |
|---|---|---|---|---|
| 3,710,072 | A * | 1/1973 | Shrader | ............... H01J 37/3053 |
| | | | | 118/726 |
| 4,994,435 | A * | 2/1991 | Shiga | ................... H01L 39/126 |
| | | | | 204/192.24 |
| 5,055,319 | A | 10/1991 | Bunshah et al. | |
| 6,214,712 | B1 * | 4/2001 | Norton | .................... C23C 14/08 |
| | | | | 117/105 |
| 7,567,036 | B2 | 7/2009 | Hirota et al. | |
| 7,781,067 | B2 | 8/2010 | Findikoglu | |
| 7,880,387 | B2 | 2/2011 | Ohtoh et al. | |
| 8,076,851 | B2 | 12/2011 | Naoi et al. | |
| 8,237,363 | B2 | 8/2012 | Mizokami et al. | |
| 8,253,333 | B2 | 8/2012 | Naoi et al. | |
| 2001/0008121 | A1 * | 7/2001 | Tanabe | .................... C23C 14/12 |
| | | | | 118/663 |
| 2006/0003087 | A1 * | 1/2006 | Takase | ...................... H01J 9/02 |
| | | | | 427/64 |
| 2007/0243328 | A1 * | 10/2007 | Liu | ........................ C23C 14/083 |
| | | | | 427/255.33 |
| 2007/0259173 | A1 | 11/2007 | Refke et al. | |
| 2009/0096375 | A1 * | 4/2009 | Yamashita | ................ H01J 9/02 |
| | | | | 313/582 |
| 2011/0049715 | A1 | 3/2011 | Taliani et al. | |
| 2011/0195196 | A1 * | 8/2011 | Kim | ...................... C23C 14/086 |
| | | | | 427/453 |
| 2011/0215719 | A1 | 8/2011 | Misawa | |
| 2013/0320331 | A1 | 12/2013 | Yamazaki | |
| 2014/0097428 | A1 | 4/2014 | Yamazaki et al. | |

OTHER PUBLICATIONS

Findikoglu, A et al. "Well-Orieted Silicon Thin Films with High Carrier Mobility on Polycrystalline Substrates", Advanced Materials, 2005, pp. 1527-1531, vol. 17, Wiley-VCH et al., Weiheim, GE.

PCT Search Report, Written Opinion of the International Searching Authority, dated Mar. 18, 2015, US.

Abukawa, T. et al. Characterization of Epitaxial MgO Growth on Si (001) Surface, Surface Science, Jun. 2010, pp. 1614-1618, vol. 604, Elsevier, USA.

Hung L.S. et ano. "Epitaxial Growth of MgO on (100) GaAs Using Ultrahigh Vacuum Electron-Beam Evaporation", Applied Physics Letters, Jun. 1992, pp. 3129-3131, vol. 60, No. 25, American Institute of Physics, USA.

Park K.C. et ano. "E-Beam Evaporated Glass and MgO Layers for Gas Panel Fabrication", IBM J. Res. Develop., Nov. 1978, pp. 607-612, vol. 22, No. 6, International Business Machines Corporation, USA.

European Search Report, dated Apr. 20, 2017, pp. 1-10, EPO.

* cited by examiner

Material: MgO on Glass (450°C)

Material: MgO on Glass (550°C)

METHODS OF PRODUCING LARGE GRAIN OR SINGLE CRYSTAL LMS

PRIORITY AND RELATED APPLICATION

This application claims priority to U.S. Provisional Patent Application Ser. No. 61/879,275, filed Sep. 18, 2013, entitled "Methods of Depositing Magnesium Oxide (MgO) Films," which is hereby incorporated by reference in its entirety.

FIELD OF THE INVENTION

The present invention relates to producing large grain or single crystal films such as Magnesium Oxide (MgO) films.

BACKGROUND OF THE INVENTION

Magnesium oxide (MgO) thin films have assumed significant importance in recent times due to two major applications, namely, as a protective layer on glass in plasma display panels and as an intermediate buffer layer between a semiconductor substrate (e.g. Si, GaAs) and a ferroelectric film (e.g. $PbTiO_3$) in oxide-based devices on semiconductors. Even more recently it has been discovered that MgO films can be of great value in the fabrication of superconductors and photovoltaic devices. For example, crystalline MgO films can be used as a buffer layer for depositing silicon on inexpensive substrates such as soda-lime glass. While methods such as Sol-Gel and Aluminum Acetylacetonate have been employed to fabricate crystalline films, the grain size of such films has been small. It has therefore been desirable to find a method for depositing large grain to single crystal MgO films for the fabrication of various devices for various electronics, solar, and microelectronic applications. Techniques such as Ion Beam Assisted Deposition have led to textured MgO films of high quality, yet IBAD is an expensive procedure and the grains are neither large nor single crystalline. Inclined Substrate Deposition (IDS) is also commonly used to deposit MgO on glass and while it is textured it is neither large grain or single crystalline. As of the date of this disclosure, no method exists for depositing large grain or single crystalline MgO films on inexpensive substrates; and no method exists that can do so in a way that is cost effective.

Accordingly what is desired is to produce large grain or single crystal films. What is also desired is to produce large grain or single crystal films at low temperature, i.e. below the softening temperature of soda-lime glass. It is also desired to obtain large grain or single crystal films on sodalime glass. It is yet another object of this invention to provide large grain or single crystal films in a cost-effective manner.

BRIEF SUMMARY OF THE INVENTION

The present invention provides a method for manufacturing film coating using an electron beam evaporation technique for the fabrication of high quality templates on glass. This method enables the manufacturing of solar cells or similar electronic and photonic applications. This fabrication technique and optimized process conditions enable rapid development of solar cell substrates for addressing better performance of solar cells.

DETAILED DESCRIPTION OF THE INVENTION

A method for growing crystalline and preferred oriented films such as but not limited to MgO is provided. Here films of MgO are deposited on a substrate such as glass via an electron beam evaporation system. The glass is held in place and at a specific growth temperature to control growth kinetics. Suitable temperatures may range from 300° C. to 600° C. A distance of six to nine inches is held between the substrate and an evaporation source. The evaporation source in one embodiment may be highly dense MgO crystals. The deposition rate of the evaporated film on the substrate may be monitored for example by a quartz crystal thickness monitor.

The system that may be used in growing the films may be a vacuum system that includes an electron beam evaporation system. In one embodiment, the vacuum system or chamber is evacuated using a cryopump (1000 l/s) backed by a dry scroll pump. Conditions for evaporating the evaporation source may include having a base pressure in the vacuum chamber of the system be better than $1 \times 10^{-7}$ Torr. The oxygen pressure in the chamber may be better than $10^{-4}$ Torr.

Figure 4:
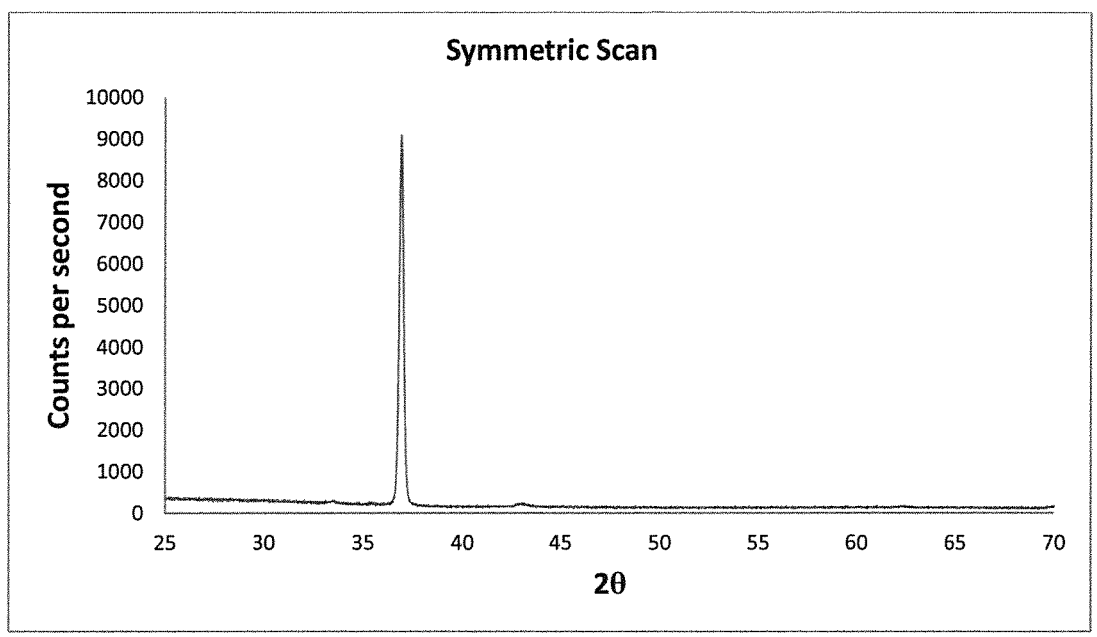
FIG. 4 shows XRD of 7 μm MgO film on soda-lime glass deposited at 550° C.

The vacuum system will have the capability of holding the substrate at the desired specific growth temperature and the desired distance from the evaporation source. In one embodiment, the chamber of the vacuum system can hold 2" and 4" wafers on a versatile heating stage and could be scaled up for 6" to 12" dia. solar cells application(s). The heating stage in the system can be programmed for substrate temperatures of up to 800° C. covering the temperature range for thin film deposition as well as in-situ annealing, if necessary. The stage can also take smaller samples using mechanical clamping. A thin-film thickness monitor and controller, such as those made by Inficon, Inc., may be used to monitor and control the deposition rate. The thickness of deposited films can be controlled by interfacing the thin-film thickness monitor and controller with an e-gun power supply. By using a remote control on the thickness controller, the emission current of the electron gun can be controlled as per the desired coating thickness. After deposition samples are cooled at 30° C./min rate. MgO films resulting from the process are highly oriented along (111) normal to the substrate surface. See FIGS. 4-5.

Figure 1:
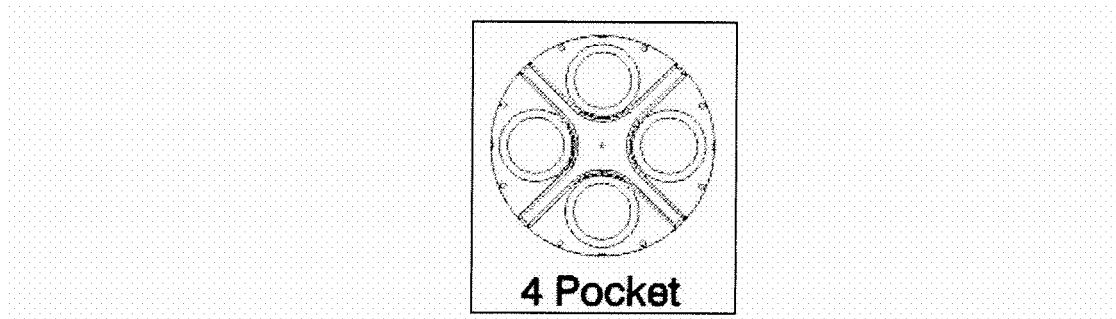
FIG. 1 shows an e-gun having four pockets.

The vacuum system BWI-1000 has a main deposition chamber—made from stainless steel equipped with a high power electron gun—of 10 Kwatt. The e-gun is used to deposit different materials including refractory metals and oxides at ease. In one embodiment, the e-gun has four pockets each handling 7 cc volume. See FIG. 1. The presence of four pockets permits the introduction of four different materials that can be sequentially evaporated, one at a time, without breaking the chamber vacuum. E-beam evaporation uses an electron beam to heat up the evaporation source. Electrons generated with a heated filament are accelerated up to 10 keV by a high voltage DC supply with a maximum emission current of 1 Amp. The electron beam is defocused to a wide beam ~1 cm in diameter to permit a high and constant rate of deposition of oxides and the materials alike.

A permanent magnet is employed to bend and guide the e-beam in a circular path from the filament to the source. Use of longitudinal and transverse sweeping coils makes it possible to raster the beam on the target. The equipment is capable of different predefined sweeping patterns. In one embodiment, the capabilities and other details of the e-gun and the power supply may follow the specifications of an e-gun produced by Telemark, Inc. For instance, the specifications may include an E-Beam Deflection of 270°, a maximum high voltage of −10 kV, lateral coil resistance of 8.5 ohms, longitudinal coil resistance of 7.5 ohms, filament power of 600 watts maximum and water cooling requirements of 2 gpm (min.) at 60° F. An exemplary gun power supply may be a power supply model TT-10. Specifications for power supply may include a maximum output power of 10 kW (1.0 A@10 kV), HV (adjustable) of 0 to −10 kV, process control voltage of 0 to +/−10 VDC, current cutback (adj.) of 0.2 to 1 amp, response time of <100 microseconds, gun filament of 5.5 V @ 36 A, a Beam Sweep Lateral Longitudinal of +/−1.5 amp@3 W, 3-90 Hz+/−2.0 amps, and cooling by Air.

The material being evaporated is placed in a crucible which occupies about 80% of the crucible volume. The crucibles are water cooled to reduce the heating effects. Additionally, crucible inserts are used to reduce heat flow during deposition thereby allowing higher evaporation rates. The use of an appropriate hearth liner also enables a quick change of evaporants with the least contamination levels. Material selection of the hearth is made based on the material being evaporated. The liners commonly available are made up of carbon, tungsten, molybdenum or tantalum.

Figure 2:
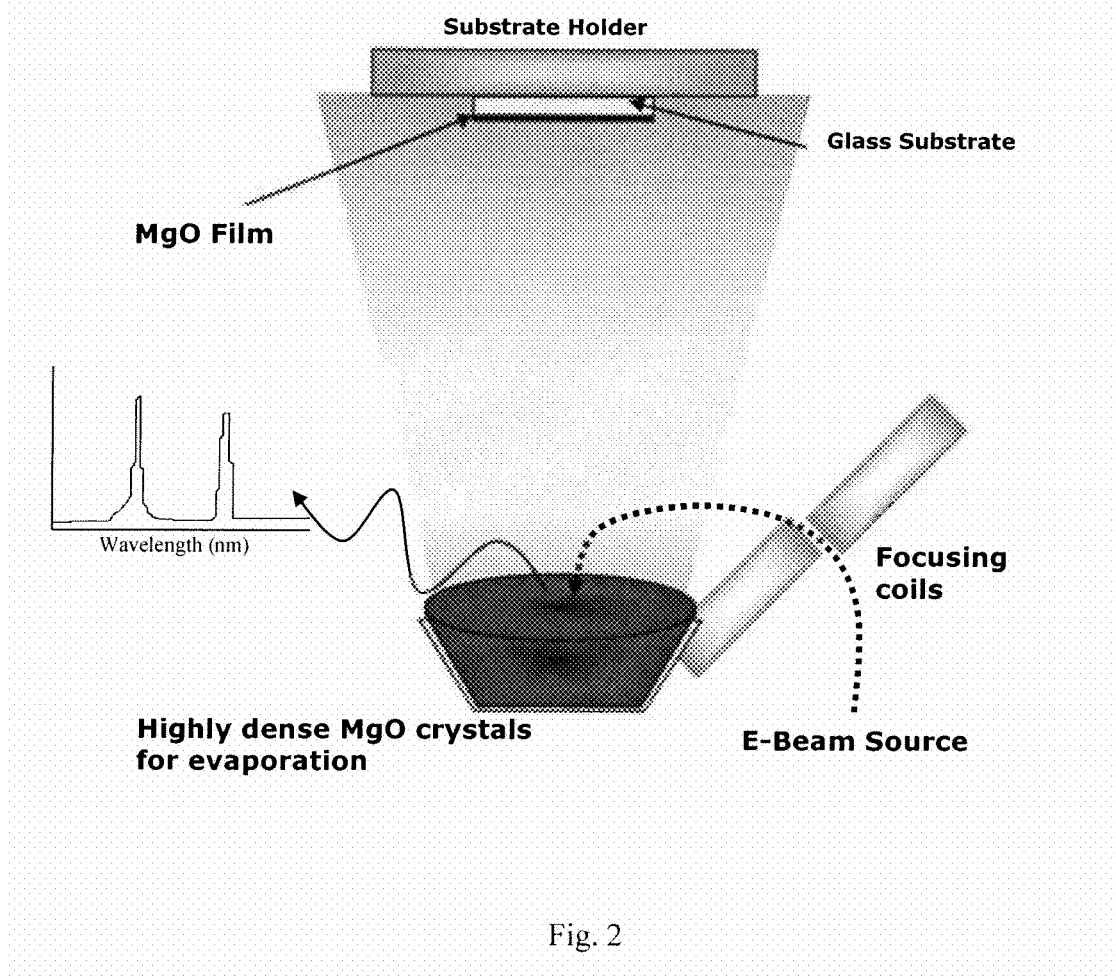
FIG. 2 shows a schematic of an electron beam evaporation technique for fabrication of films such as magnesium oxide coatings for solar cell applications.

FIG. 2 shows the schematic of the reactive electron beam evaporation technique. The invention optimizes various process parameters such as substrate temperature, oxygen pressure, evaporation rate, sample to e-beam distance, and base pressure. Of these parameters, evaporation rate and substrate temperature influence properties of the deposited films. Primary consideration when deciding a deposition rate, using electron gun (e-gun), is the film properties at the development stage and eventually the production rate, since very high rates are not compatible with certain film properties. It is thus important to consider various parameters in e-gun evaporation from the beginning of the product development. The ease of evaporation and fabricating good quality thin films depends on different factors, e.g. power supply ratings, system geometry, source material, evaporation rate, substrate-source distance etc. In the present case, the desired evaporation rates are easily possible by 10 kilowatt power supply interfaced with the e-gun. Films produced using the method of the current invention may have a variety of applications ranging from photovoltaics to displays. For example the invention can further be used for deposition of $Al_2O_3$ on MgO films on glass.

Examples

A substrate is held in an e-beam evaporation system with a source of MgO being coated at 7 μm on a 3.2 mm thick soda-lime glass. Two samples were prepared one at 450° C. and the other at 550° C. both at temperatures below the softening point of ordinary soda-lime glass. The deposition was made on the substrate using an e-gun by the method described above. The resulting is MgO coatings were characterized by x-ray diffraction and scanning electron microscopy and electrical resistivity.

Figure 3:
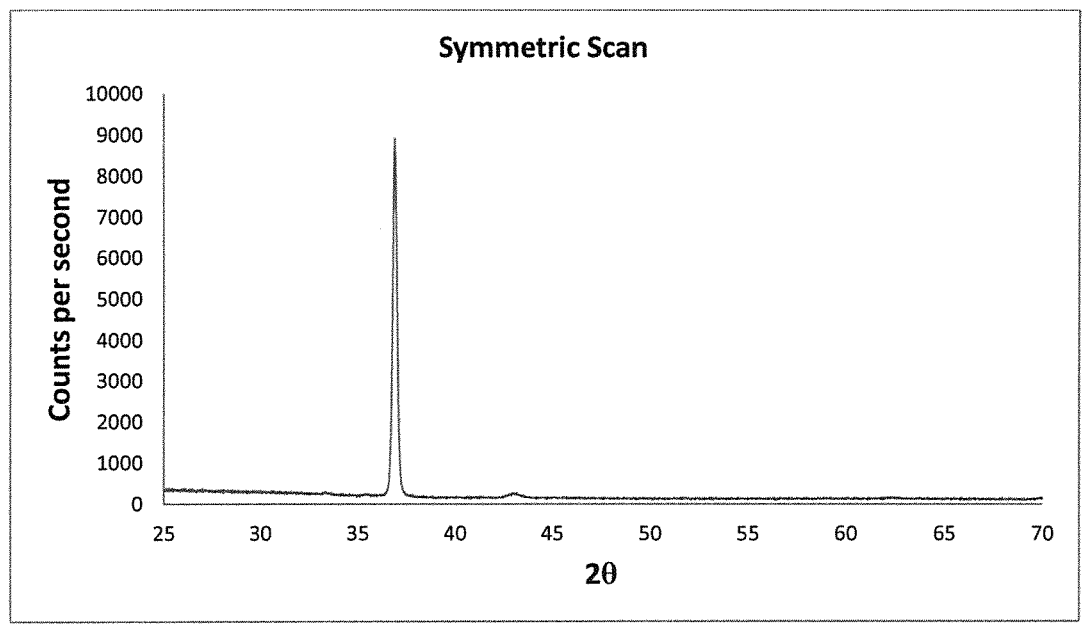
FIG. 3 shows XRD of 7 μm MgO film on soda-lime glass deposited at 450° C.

X-ray diffraction results indicated that the coatings fabricated are highly oriented along (111) and thus are highly crystalline. See FIGS. 3 and 4. Characteristic peaks for MgO are observed at 36.93° [111], 42.90° [200], 74.67° [311], and 78.61° [222]. The films are optically transparent and have smooth and uniform surface roughness that are required for good quality optical coatings. It has also been discovered that a higher evaporation or deposition rate is beneficial for highly textured films. Note that the coating fabricated in the present invention has a high chemical purity phase.

While the present invention has been described in conjunction with specific embodiments, those of normal skill in the art will appreciate the modifications and variations can be made without departing from the scope and the spirit of the present invention. Such modifications and variations are envisioned to be within the scope of the appended claims.

The invention claimed is:

1. A method of growing crystalline, films with a preferred orientation comprising:
    positioning a substrate in a vacuum system of an electron beam evaporation system;
    holding the system at a constant temperature thereby controlling growth kinetics, wherein the constant temperature is below a softening temperature of the substrate;
    positioning an evaporation source a distance between 5 and 10 inches from said substrate;
    holding the system at a base pressure and an oxygen pressure;
    heating the evaporation source with an electron beam;
    evaporating the evaporating source and coating a film from the evaporation of the evaporation source onto the substrate, wherein the film has a high chemical purity phase;
    cooling the film coated substrate after the film has reached a desired thickness at a defined cooling rat;
    wherein the preferred orientation is [111].

2. The method of claim 1, wherein the base pressure is lower than $1 \times 10^{-7}$ Torr.

3. The method of claim 1, wherein the oxygen pressure is lower than $10^{-4}$ Torr.

4. The method of claim 1, further comprising monitoring a deposition rate of the evaporation source using a quartz crystal thickness monitor.

5. The method of claim 1, wherein the evaporation source is MgO crystals.

6. The method of claim 1, wherein the film is cooled at the cooling rate of 30° C./min.

7. The method of claim 1, wherein the substrate is soda-lime glass.

8. The method of claim 1, wherein the constant temperature is between 300° C. and 600° C.

9. The method of claim 1 further comprising bending and guiding the electron beam in a circular path from a filament to the evaporation source with a permanent magnet.

10. The method of claim 9 further comprising forming the electronic beam on the evaporation source with the use of longitudinal and transverse sweeping coils.

* * * * *